United States Patent [19]

Otsuka et al.

[11] Patent Number: 5,334,856
[45] Date of Patent: Aug. 2, 1994

[54] IMAGE READOUT ELEMENT WITH OXYTITANIUM PHTHALOCYANINE

[75] Inventors: Shigenori Otsuka, Omiya; Hiromi Horiuchi; Masayuki Hiroi, both of Tokyo, all of Japan

[73] Assignee: Mitsubishi Kasei Corporation, Tokyo, Japan

[21] Appl. No.: 97,919

[22] Filed: Jul. 28, 1993

Related U.S. Application Data

[63] Continuation of Ser. No. 725,602, Jul. 3, 1991, abandoned.

[30] Foreign Application Priority Data

Jul. 3, 1990 [JP] Japan ................. 2-175680

[51] Int. Cl.$^5$ ............................................. H01L 27/14
[52] U.S. Cl. ........................................ 257/40; 257/443; 257/448; 257/80; 430/58; 430/78; 540/143
[58] Field of Search ............... 257/40, 80, 443, 448; 430/58, 59, 78, 96; 540/141, 143

[56] References Cited

U.S. PATENT DOCUMENTS

| | | | |
|---|---|---|---|
| 4,956,256 | 9/1990 | Ohtsuka et al. | 430/58 X |
| 4,987,430 | 1/1991 | Clarisse et al. | 357/8 |
| 4,994,566 | 2/1991 | Mimura et al. | 430/58 X |

FOREIGN PATENT DOCUMENTS

| | | | |
|---|---|---|---|
| 61-54662 | 3/1986 | Japan . | |
| 61-217050 | 9/1986 | Japan | 357/8 |
| 61-285262 | 12/1986 | Japan . | |
| 61-291657 | 12/1986 | Japan . | |
| 62-67094 | 3/1987 | Japan . | |
| 63-20365 | 1/1988 | Japan . | |
| 1184961 | 7/1989 | Japan . | |
| 2213172 | 8/1990 | Japan . | |

OTHER PUBLICATIONS

Delacote et al., "Electron Insection in Thin Films of Copper Phtalocyanine," *Solid State Communications*, vol. 2, Pergamon Press, USA, 1964, pp. 373–376.

Turevc et al., "A New Series of Molecular Semiconductors: Phthalocyanine Radicals," *J. Am. Chem. Soc.*, vol. 109, No. 17, 1987, pp. 5119–5122.

*Primary Examiner*—William Mintel
*Attorney, Agent, or Firm*—Oblon, Spivak, McClelland, Maier & Neustadt

[57] ABSTRACT

An image readout device having a plurality of readout elements for converting image into electrical signals, each element having a photoconductive layer and a pair of electrodes which contact the photoconductive layer, and between which the layer is disposed. The photoconductive layer contains a charge generation material and a charge transport material. Oxytitanium phthalocyanine is used as the charge generation material.

8 Claims, 8 Drawing Sheets

IMAGE READOUT ELEMENT WITH OXYTITANIUM PHTHALOCYANINE

This application is a continuation of application Ser. No. 07/725,602, filed Jul. 3, 1991, now abandoned.

BACKGROUND OF THE INVENTION

1. Field of the Invention

This invention relates to an image readout element which is used in an image sensor to read out an image by converting image signals into electrical signals. More particularly, it is of the type in which an organic photoconductive material is used as a photoelectric conversion material.

2. Description of the Prior Art

A photosensor or an image sensor is used for a wide range of purposes, for example, for measuring the intensity of light, as a position sensor in a robot, or automation system, and for reading out visual information in data communication or processing. The recent progress in the technology for image information processing has created a strong demand for an improved image sensor which can be used as an image input device having a high level of performance. A facsimile system, a word processor and an electronic filing system are typical of the apparatuses which require image input devices.

There are two kinds of image input devices, i.e., a video camera, or like device which supplies information in a two-dimensional form, and an image scanner which employs a line sensor to scan and read out an image. It is, however, usual to employ the latter type of device in order to achieve a satisfactorily high resolving power, or resolve a satisfactorily large number of picture elements, or pixels. A charge-coupled device sensor made by employing crystalline silicon is used as a typical line sensor. This sensor has, however, the drawback that the limited size of the device makes it essential to use a scaling-down optical system to read out a large image. There is also known a sensor having a photoconductive plate formed from cadmium sulfide or amorphous silicon. These sensors can have a relatively large area of photoconductor and its combination with a rod lens array has already realized a contact type line image sensor having the same length with the width of a document.

The limited availability of the appropriate film-forming processes has, however, made it difficult to form a film on a mass-production basis from any photoconductive material that has hitherto been used. As a consequence, it has been substantially impossible to make a line sensor which is sufficiently long for scanning a large image. Moreover, such material gives rise to so high a dark current that it is impossible to achieve a high signal-to-noise (S/N) ratio, and it is necessary to separate every two adjoining elements apart from each other.

There are also known image sensors having photoconductive surfaces formed from organic materials. These sensors have a number of advantages. A film of any such organic material is easy to form from a solution thereof by a coating method which is high in productivity. A film covering a large area is easy to form. The material is so low in dark current that it is possible to attain a high S/N ratio. Japanese Patent Application Laid-Open No. 285262/1986, 291657/1986, or 184961/1989 discloses a sensor having a photoconductive surface layer formed from an azo dye, a binder and a charge transport material. Japanese Patent Application Laid-Open No. 54662/1986 mentions copper phthalocyanine, magnesium phthalocyanine and metal-free phthalocyanine as examples of applicable organic materials, and describes a sensor having a photoconductive surface layer formed from metal-free phthalocyanine and a binder.

The sensors made by employing organic materials have, however, had too many drawbacks to be satisfactory for practical use. Their drawbacks include low sensitivity, a low response speed, the formation of a residual image which is due to the fatigue of the photoconductive layer, and the reduction of the S/N ratio after continuous use. The low response speed of any such sensor, which is due to the organic material used, has, among others, been a serious drawback.

SUMMARY OF THE INVENTION

Under these circumstances, it is an object of this invention to provide an improved image sensor which has a photoconductive layer formed from an organic material, and which has a large area of photoconductive layer, and is high in sensitivity, quick in response, and high in reliability.

This object is attained by an image readout device comprising an integration of readout element for converting image signals into electrical signals, each element comprising a photoconductive layer and a pair of electrodes which contact the photoconductive layer, and between which the layer is disposed, wherein said photoconductive layer contains a charge generation material and a charge transport material, and contains oxytitanium phthalocyanine as the charge generation material.

DETAILED DESCRIPTION OF THE INVENTION

Figure 1A:
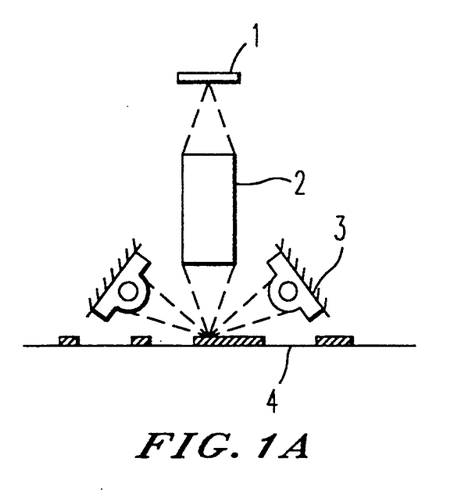
FIG. 1(a) is a schematic representation of an image sensor including an image readout device embodying this invention.
Figure 1B:
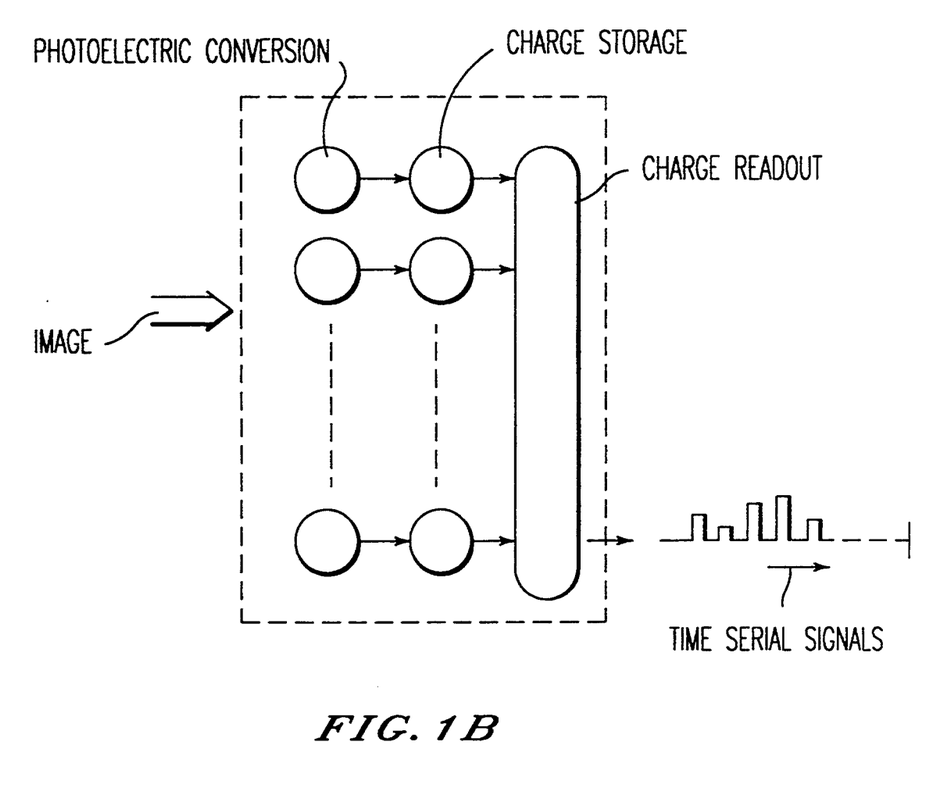
FIG. 1(b) is a chart showing the flow of signals in the image sensor of FIG. 1 (a)

Referring first to FIG. 1(a), there is shown by way of example a contact type line image sensor including an image readout device embodying this invention. The light which has been applied from a light source 3 to an original document is reflected on its surface, and an image signal so reflected is transmitted to the photoconductive layer of the image sensor 1 by a rod lens array 2, and photoelectrically converted signals are progressively read out as time serial signals through a switching device connected to an individual electrode. The original document 4 is moved relative to the image sensor 1, so that the whole image information which it contains may be read out as electrical signals.

Figure 2A:
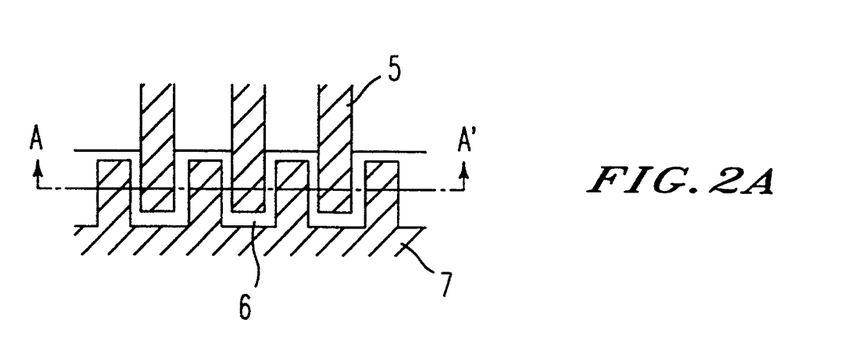
FIG. 2(a) is a overhead view of a planar type image readout device embodying this invention.
Figure 2B:
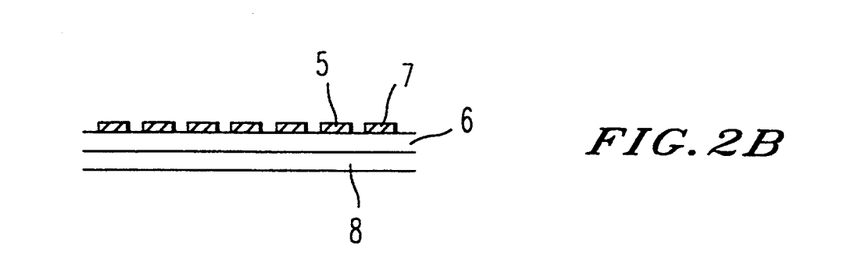
FIG. 2(b) is a sectional view taken along the line A—A' of FIG. 2(a)
Figure 3A:
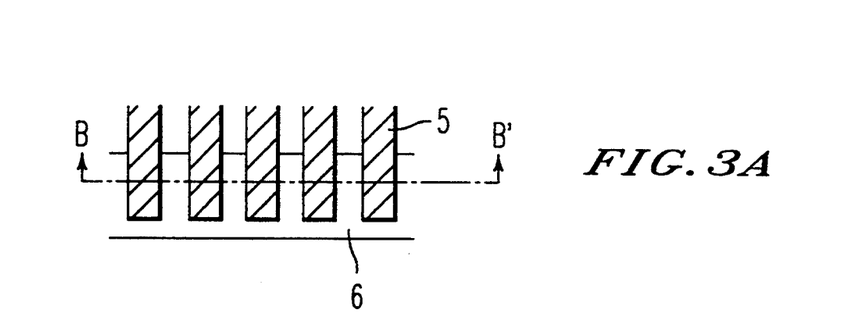
FIG. 3(a) is a overhead view of a sandwich type image readout device embodying this invention.
Figure 3B:
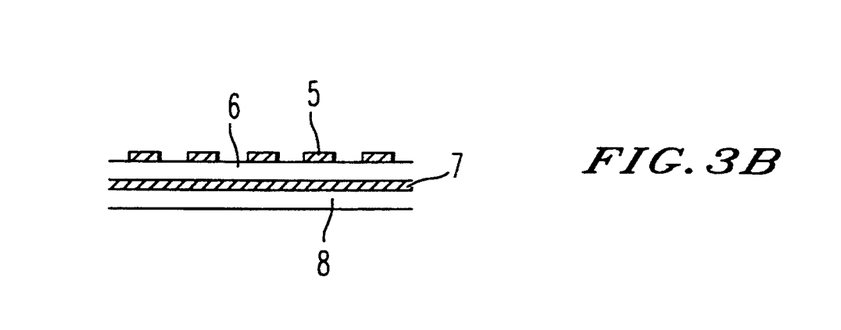
FIG. 3(b) is a sectional view taken along the line B—B' of FIG. 3(a)
Figure 4:
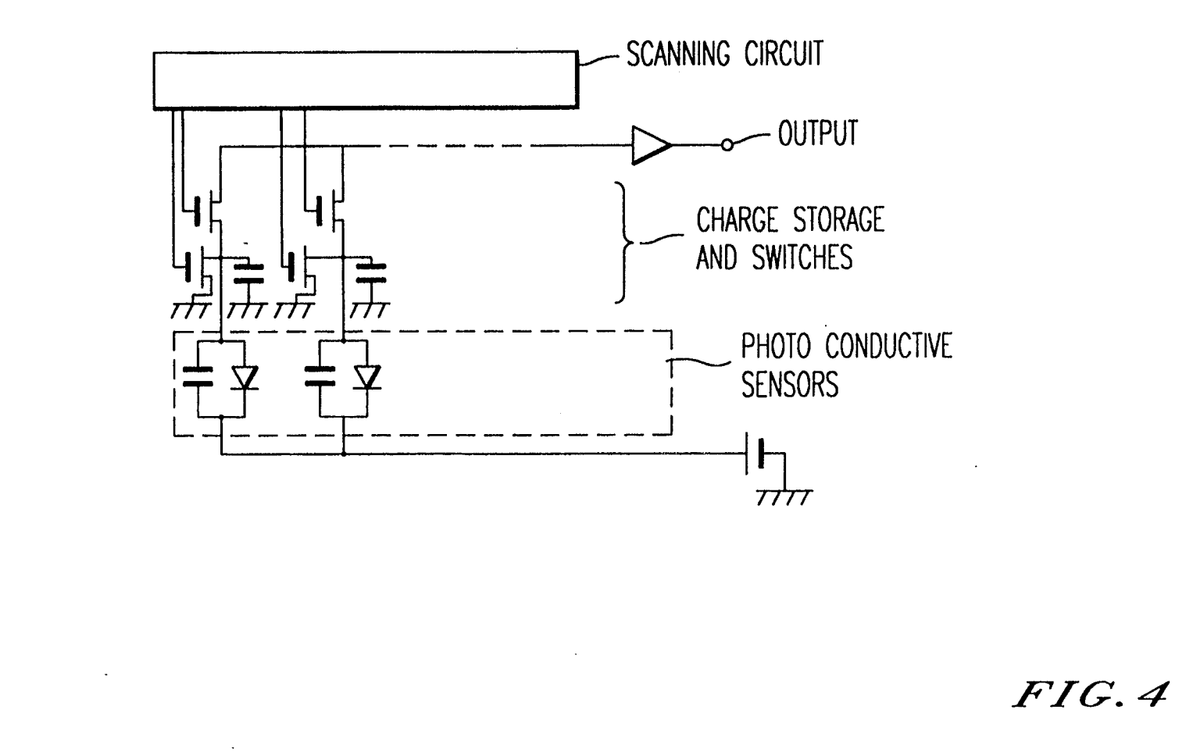
FIG. 4 is a diagram showing an electric circuit for the image sensor including the image readout device embodying this invention.

The image readout device in the sensor may be of the planar type as shown in FIGS. 2(a) and 2(b), or of the sandwich type as shown in FIGS. 3(a) and 3(b). A sandwich type of element is, however, preferred, since the organic photoconductive material has a high dependence of properties on the strength of an electric field and had, therefore, better be used under a high electric field. There are two types of readout elements as classified by the way in which the photocurrent generated by the element is read out, i.e., a charge storage type in which the charge stored in a capacitor is read out, and a photocurrent type in which the photocurrent itself is directly read out. The former type of element is preferred from the standpoint of sensitivity. The individual elements are progressively switched from the individual electrodes by the switching device to produce an output corresponding to the input light. The readout elements, each comprising a photoconductive layer and a pair of electrodes, are arranged in a one-dimensional pattern to form a line sensor, or in a two-dimensional pattern to form a picture-sensing element. An electric circuit for the line sensor is shown by way of example in FIG. 4.

Further details of the image readout device of the present invention are explained hereinafter. The photoconductive layer is formed on a support on which the electrodes may also be provided. The electrodes in a planar type of element are usually formed in the shape of a comb as described in FIG. 2(a). The individual electrodes 5 and a common electrode 7 may be provided on one surface of the photoconductive layer 6, or on the support 8. The support needs to be sufficiently transparent if an image signal i.e., the light reflected from an original image is projected from the support side.

According to a preferred aspect of this invention, the element is of the sandwich type such as the one shown in FIG. 3(a). It comprises a photoconductive layer formed on a support provided with an electrode, and a counter electrode provided on the photoconductive layer. Either one of the electrodes can be an individual electrode. One individual electrode, a counter electrode facing to the individual electrode and the photoconductive layer interposed between the pair of said two electrodes define one readout element which can read out an image signal corresponding to the light inputted to it. One of the pair of electrodes and the photoconductive layer may be common to all the readout elements. At least one side of the electrodes is required to form a light path which can transmit an incident light satisfactorily. A transparent electrode may be formed by a thin film of a metal oxide such as indium oxide, tin oxide, or an oxide of indium and tin, or of a metal such as silver, gold or aluminum. The counter electrode may be formed from a variety of kinds of metals, such as aluminum, gold, silver, copper, or nickel. The support needs to be sufficiently transparent, too, if the light of the image signal is projected to the element from the support side.

The two electrodes forming a pair of electrodes in each element contact the photoconductive layer and do not contact each other. The photoconductive layer is disposed between the two electrodes so that a photo current may flow between the two electrodes through the photoconductive layer.

The photoconductive layer contains at least a charge generation material and a charge transport material as its effective components. The charge generation material absorbs projected light and generates a charged carrier. The charge transport material receives the carrier from the charge generation material and transports the charge.

Figure 5A:
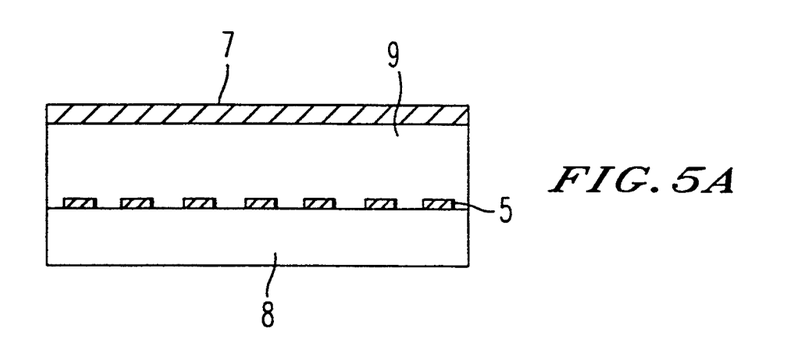
FIG. 5(a) is a sectional view of an image readout device embodying this invention and having a photoconductive layer of the disperse type.
Figure 5B:
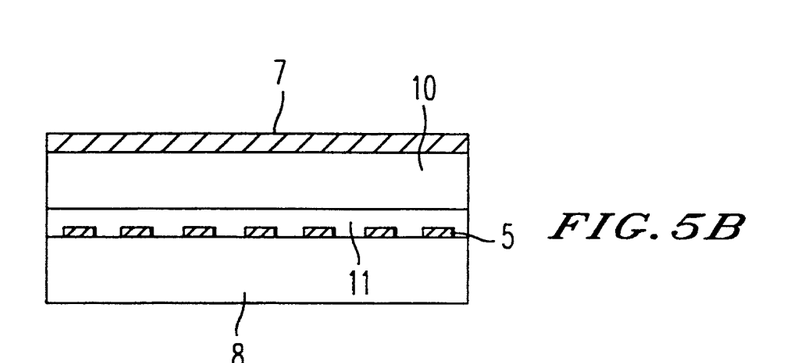
FIG. 5(b) is a sectional view of an image readout device embodying this invention and having a photoconductive layer of the layered type.
Figure 5C:
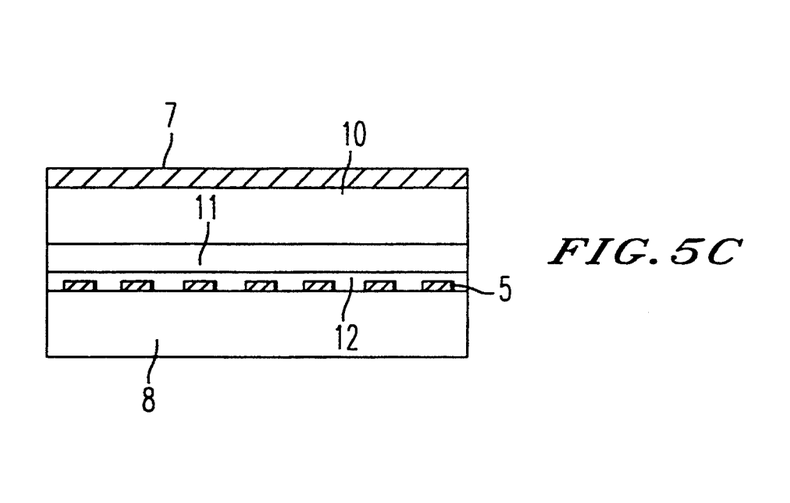
FIG. 5(c) is a sectional view of an image readout device embodying this invention, having a photoconductive layer of the layered type and a blocking layer formed between the photoconductive layer and an electrode.

The photoconductive layer may be composed in different ways as shown by way of example in FIGS. 5(a) to 5(c). FIG. 5(a) shows a photoconductive layer 9 of the disperse type which is formed by dispersing a charge generation material in a matrix prepared by dissolving a charge transport material in a binder resin. FIG. 5(b) shows the layered type which comprises a layer 11 of a charge generation material and a layer 10 of a charge transport material laid thereon. It is recommended to make a blocking contact between the electrode and the photoconductive layer for example by selecting materials or compositions thereof in order to minimize a dark current. If necessary, a blocking layer 12 may be provided between one of the two electrodes and the photoconductive layer, as shown in FIG. 5(c).

According to this invention, oxytitanium phthalocyanine is used as the charge generation material.

Various crystal forms of oxytitanium phthalocyanine are known to exist. They differ greatly from one another in charge generating efficiency and response speed. For the purpose of this invention, therefore, it is preferable to use A, B and D type crystals of oxytitanium phthalocyanine having X-ray diffraction patterns as shown in FIGS. 6(a) to 6(c), respectively.

Figure 6A:
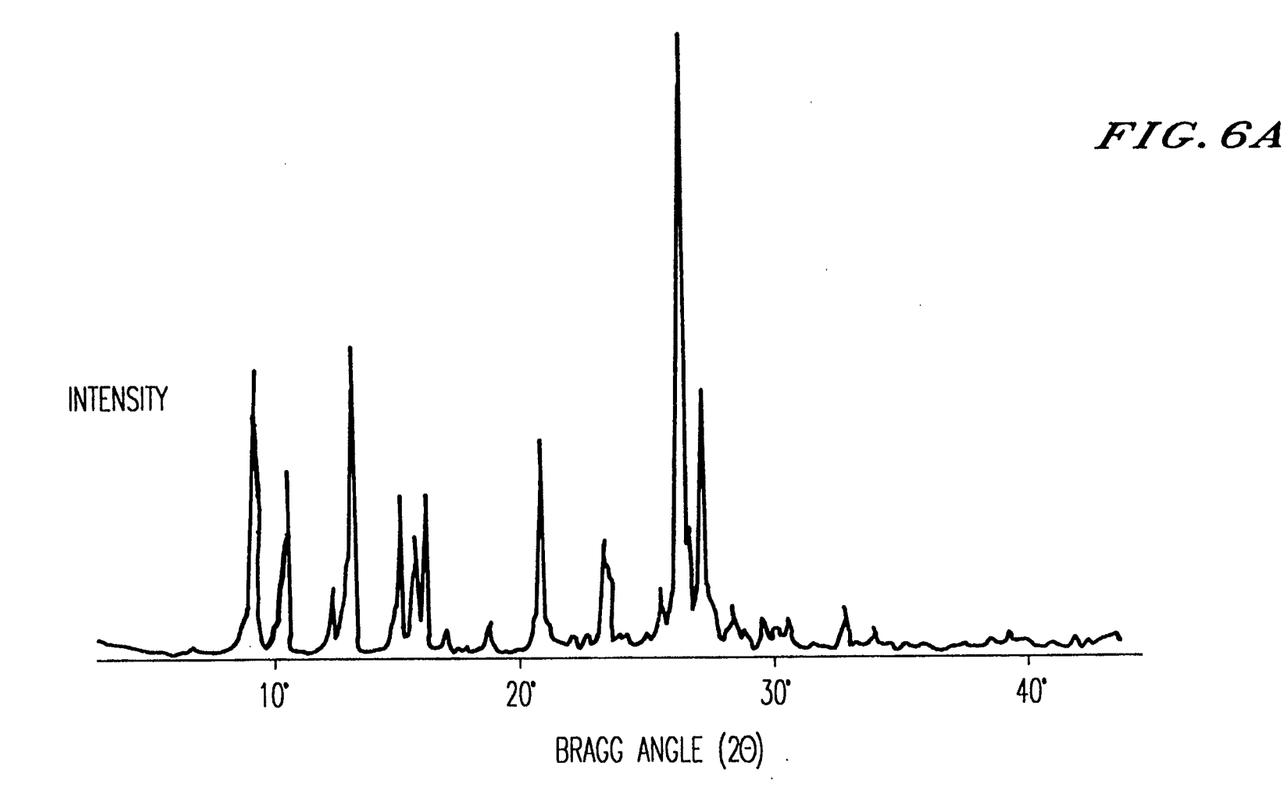
FIG. 6(a) is a diagram showing the X-ray diffraction spectrum of the A type crystal of oxytitanium phthalocyanine used as a charge generation material in an image readout element embodying this invention.

FIG. 6(a) shows the typical X-ray diffraction pattern of the A type crystal of oxytitanium phthalocyanine. It shows strong diffraction peaks particularly at the Bragg angles ($2\theta \pm 0.2°$) of 9.3°, 10.6°, 13.2°, 15.1°, 15.7°, 16.1°, 20.8°, 23.3°, 26.3° and 27.1°.

Figure 6B:
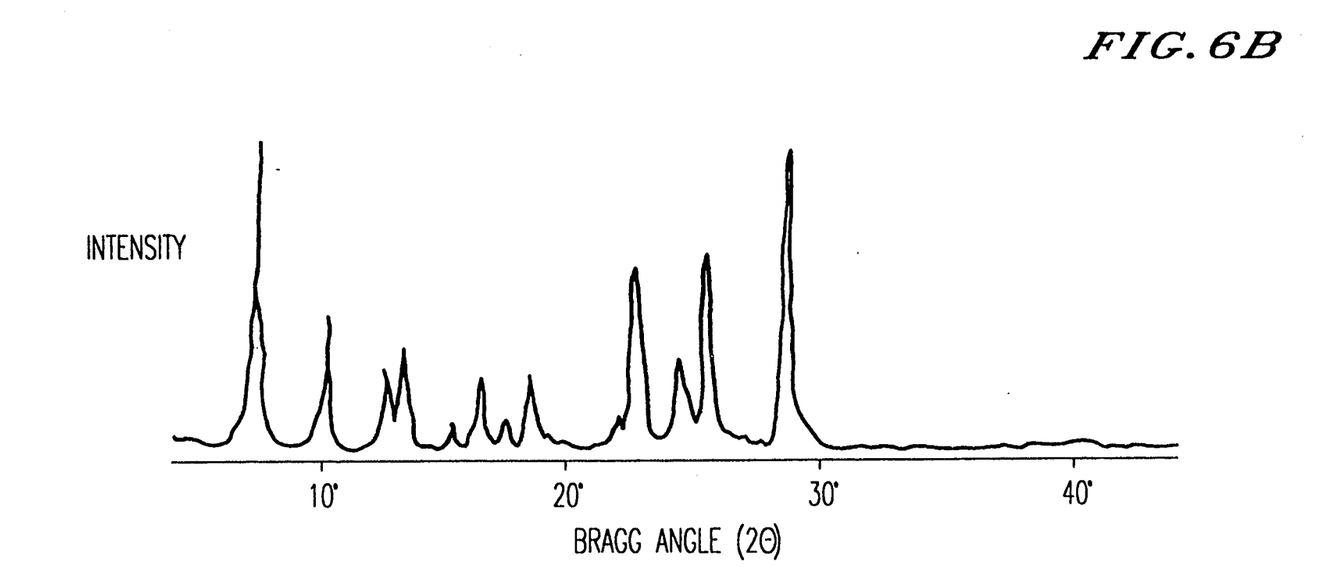
FIG. 6(b) is a diagram similar to FIG. 6(a), but showing the X-ray diffraction spectrum of the B type crystal of oxytitanium phthalocyanine.

FIG. 6(b) shows the typical X-ray diffraction pattern of the B type crystal. It shows strong diffraction peaks particularly at the Bragg angles ($2 \pm 0.2°$) of 7.5°, 22.3°, 25.3° and 28.6°.

Figure 6C:
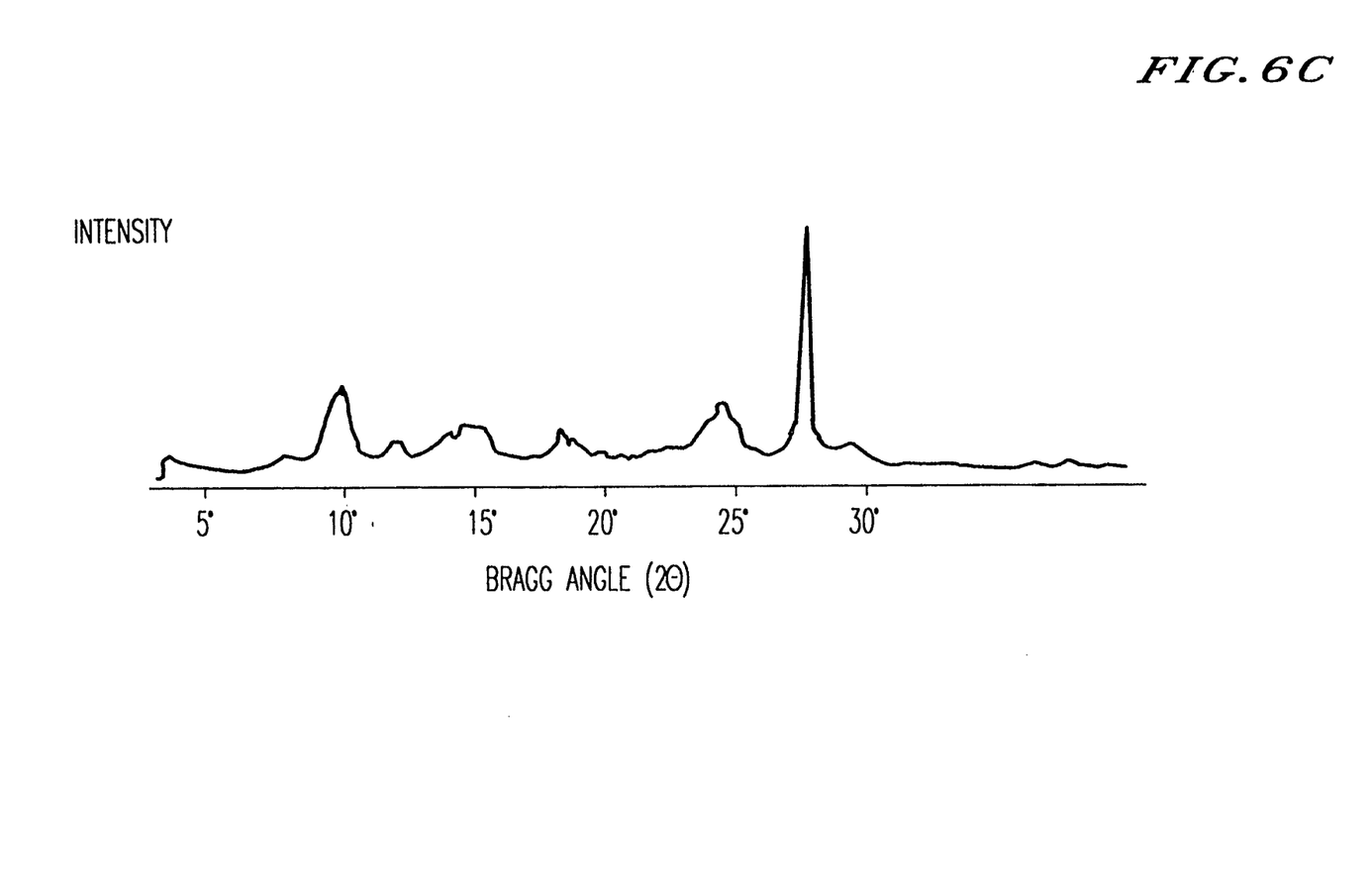
FIG. 6(c) is a diagram similar to FIG. 6(a), but showing the X-ray diffraction spectrum of the B type crystal of oxytitanium phthalocyanine.

FIG. 6(c) shows the typical X-ray diffraction pattern of the D type crystal. It shows peaks at the Bragg angles

(2θ±0.2°) of e.g. 9.7°, 24.1° and 27.3°, including a clear peak at 27.3°.

Oxytitanium phthalocyanine having any of these crystal forms can be synthesized by a known method as described in, for example, Japanese Patent Application Laid-Open No. 67094/1987, 217050/1986 or 20365/1988. The phthalocyanine may be dispersed in the binder resin in which the charge transport material has been dissolved (photoconductive layer of the disperse type), or may be dispersed in a binder to form a charge generation layer, on which a charge transport layer comprising a charge transport material and a binder is laid to form a photoconductive layer of the layered type.

The charge transport material may be selected from among a variety of known materials. Specific examples include a hydrazone derivative, a pyrazoline derivative, an arylamine derivative such as triphenylamine, a derivative of a heteroxyclic compound such as carbazole, indole or oxadiazole, a stilbene derivative, and a high molecular compound containing any of the above compounds in its side or principal chain. A hydrazone derivative, arylamines and a stilbene derivative area, among others, preferred. Typical examples of the preferred compounds are shown by formulas in TABLE 1 below.

1

2

3

4

5

-continued

6

7

8

9

10

11

-continued

12

Examples of the resin used as the binder to form the charge transport layer in a photoconductive layer of the layered type are an acrylic resin, a styrene resin, a polyvinylacetal resin, a vinyl chloride resin, an epoxy resin, a polyester resin, a polycarbonate resin, a polyallylate resin, a silicone resin, and a crosslinking resin such as a urethane, urea, or melamine resin. The charge transport layer is preferably formed by mixing 50 to 1000 parts by weight of charge transport material and 100 parts by weight of binder resin. The same resins can be used to form the charge generation layer. This layer is preferably formed by employing 20 to 400 parts by weight of oxytitanium phthalocyanine and 100 parts by weight of binder resin.

The charge transport layer preferably has a thickness of 0.2 to 20 microns. A thickness of 0.5 to 5 microns is more preferable. The charge generation layer preferably has a thickness of 0.05 to 2 microns. A thickness of 0.1 to 1 micron is more preferable.

The same kind of binder resin is also used to form a photoconductive layer of the disperse type which consists of a single layer. This layer is preferably formed by employing 50 to 200 parts by weight of charge transport material, 5 to 100 parts by weight of oxytitanium phthalocyanine and 100 parts by weight of binder resin. The layer preferably has a thickness of 0.1 to 20 microns. A thickness of 0.5 to 5 microns is more preferable. The layer may further contain a known additive or additives.

The blocking layer may be provided between the photoconductive layer and one of the two electrodes, as hereinbefore mentioned. It can be formed from, for example, a copolymerized nylon resin such as 6-66-12, 6-66-11, 6-66-610 or 6-L12-620, alkoxyalkylnylon, polyurethane, a phenolic resin, casein, polyvinylacetal, or a cured epoxy resin. The resin may contain fine particles of a conductive or semiconductive material. The layer may have a thickness of 0.01 to 20 microns, depending on the material from which it is formed.

The image readout device in this invention is formed as an integration of the image readout element described above. The integration is the most frequently attained by arranging plural elements in one-dimensional array or one straight line. However, the present invention is not limited to that arrangement, but may include possible variations of the arrangement such as a bending or winding line, a connection of either straight, bending or winding lines, a combination of plural lines including straight, bending and/or winding connected lines, or even two-dimensional stretch, depending upon a requirement or a preference of an application of the device. The number of the elements in the device is also widely variable, but normally corresponds to the number of pixels in an original image to be read out at the same time.

At present, the elements may be integrated up to about 20 elements/mm, but when the technology to make the individual electrode or eventually one element in more finely divided state is improved, this number is increased accordingly. Naturally, the finer integration of the elements provides an ability to read out the finer pixels and eventually to give the device higher resolution.

The invention will now be described in further detail with reference to several examples. It is, however, to be understood that the following description is not intended to limit the scope of this invention.

EXAMPLE 1

The image readout single element of sandwich type is formed in the layered type as described in FIG. 5(c), but wherein the thickness of the top electrode (it becomes a common electrode, if integrated) 7 it 1000 Å, and the bottom electrode (it becomes an individual electrode, if integrated) 5 has 0.1 μm thickness and 0.3 mm width.

A glass plate 8 carrying the individual, and transparent electrode 5 formed from indium-tin oxide (ITO) was dipped in a solution prepared by dissolving 6-66-12 copolymerized nylon (DAIAMIDE T171, product of Daisel Ltd.) in n-propanol, whereby a film having a dry thickness of 0.3 micron as an blocking layer 12 was formed on the glass plate. A coating solution was prepared by dispersing 10 g of oxytitanium phthalocyanine having the A type crystal structure as determined by X-ray diffraction in dimethoxyethane by a sand grinder, and mixing its dispersion with a solution obtained by dissolving 5 g of a polyvinyl butyral resin (S-Lec BH-3, product of Sekisui Chemical Co., Ltd.) in dimethoxyethane. The nylon layer was dipped in the coating solution, whereby a charge generation layer 11 having a dry thickness of 0.4 micron was formed on the nylon layer. The charge generation layer was dipped in a solution prepared by dissolving 100 g of polycarbonate (NOVAREX 7025A, product of Mitsubishi Kasei Corp.), 80 g of compound 3 in TABLE 1 and 20 g of compound 6 in TABLE 1 in tetrahydrofuran, whereby a charge transport layer 10 having a dry thickness of 0.7 micron was formed on the charge generation layer. A common counter electrode 7 was formed on the charge transport layer by the vacuum deposition of aluminum, whereby an image readout device was obtained. The single element in the device was evaluated as an element to read out one pixel for an image sensor.

Figures 7A, 7B:
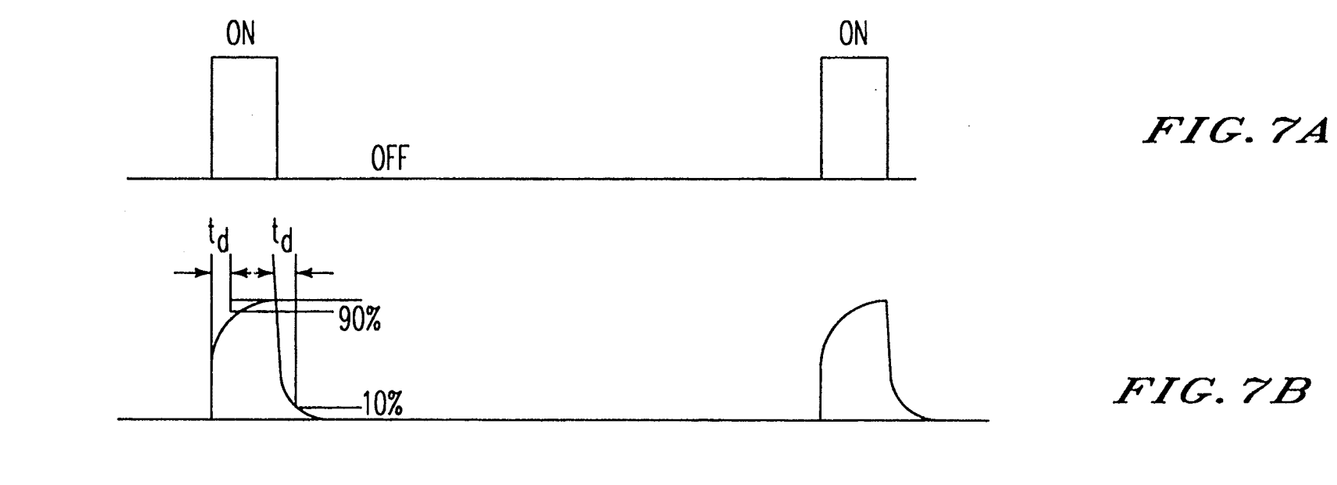
FIG. 7(a) is a diagram showing the light-emitting operation of a light-emitting diode used for examining the response characteristics of image readout elements in several examples as will hereinafter be described.
FIG. 7(b) is a diagram showing with the passage of time the electric current as found to flow in the image readout element exposed to light emitted by the light-emitting diode.

The element was exposed through the transparent electrode to light from a yellow light-emitting diode, gated with an ON time of 5 msec. and an OFF time of 50 msec., as shown in FIG. 7(), while a voltage of 45 V was applied to it, whereby the element was evaluated for photocurrent, dark current, and the response characteristics including the rise and decay times of the photocurrent. When the element was exposed to light having an illuminance of 100 lx, it gave rise to a photocurrent of $3.0 \times 10^{-7}$ A/cm$^2$ and a dark current of $2.0 \times 10^{-9}$ A/cm$^2$. It showed a rise time, $T_r$, of 1.6 msec. and a decay time, $T_d$, of 3.4 msec. These results confirmed the satisfactorily high sensitivity of the element to light and its satisfactorily high response speed.

shown in TABLE 2. The element showed so long a decay time as to be capable of working only at a very low speed.

EXAMPLE 2

An element was prepared by repeating EXAMPLE 1, except that oxytitanium phthalocyanine having the B type crystal form as determined by X-ray diffraction was used to form the charge generation layer. EXAMPLE 1 was also repeated for evaluating the element as a readout device for an image sensor. The results are shown in TABLE 2 below. The results confirmed satisfactorily high sensitivity, S/N ratio, and response speed of the element.

EXAMPLE 3

An element was prepared by repeating EXAMPLE 1, except that D type oxytitanium phthalocyanine was used to form the charge generation layer. The results of its evaluation are shown in TABLE 2. It gave rise to a still greater amount of photocurrent and was found to have very high sensitivity.

EXAMPLE 4

An element was prepared by repeating EXAMPLE 1, except that compound 7 in TABLE 1 was used to form the charge transport layer. The results of its evaluation are shown in TABLE 2. It showed still better rise and decay times and was found to be capable of working at a higher speed.

COMPARATIVE EXAMPLE 1

An element was prepared and evaluated by repeating EXAMPLE 1, except that Chlorodiane Blue, the bisazo dye having the structural formula shown below, was used as the charge generation material. The results are

EXAMPLE 5

A coating solution was prepared by dispersing 10 g of A type oxytitanium phthalocyanine in dimethoxymethane by a sand grinder, and mixing its dispersion with a solution containing 10 g of hydrazone compound shown at 3 in TABLE 1, and 10 g of a bisphenol-C type polycarbonate resin having a viscosity-average molecular weight of 31,000. The solution was used to form a photoconductive layer having a thickness of 1.5 microns on a copolymerized nylon-coated base duplicating that which had been used in EXAMPLE 1. An aluminum electrode was formed thereon by evaporation, whereby an element was obtained. The results of its evaluation are shown in TABLE 2, and confirm its satisfactorily high sensitivity and response speed.

EXAMPLE 6

A light-receiving device was made by placing 128 elements in a one-dimensional array, each element having a similar construction to that described in EXAMPLE 1 except that the distance of the adjoining individual electrodes was 0.2 mm to give the device an ability to read out 2 pixels/mm, and connecting the array to a binary charge-storage circuit provided with an analog switch and an amplifier. A Selfoc lens and a LED illuminating system were attached to the unit to make a line image sensor. It had a switching clock of 50 kHz and a line scanning time (repeat time) of 20 msec. When the image sensor was used to scan a document, black and white binary signals were correctly obtained. When the signals were fed to a computer, they gave a clear pattern of the document on a CRT display.

TABLE 2

|  | Photocurrent (A/cm$^2$) | Dark current (A/cm$^2$) | Rise time $T_r$ (msec) | Decay time $T_d$ (msec) |
| --- | --- | --- | --- | --- |
| EXAMPLE 2 | $4.0 \times 10^{-7}$ | $2.1 \times 10^{-9}$ | 1.7 | 3.5 |
| EXAMPLE 3 | $1.1 \times 10^{-6}$ | $2.5 \times 10^{-9}$ | 1.6 | 3.8 |
| EXAMPLE 4 | $5.0 \times 10^{-7}$ | $3.0 \times 10^{-9}$ | 1.5 | 1.8 |
| COMPARATIVE EXAMPLE 1 | $1.0 \times 10^{-7}$ | $8.0 \times 10^{-10}$ | 3.5 | 30.0 |
| EXAMPLE 5 | $1.5 \times 10^{-5}$ | $1.1 \times 10^{-7}$ | 0.08 | 0.1 |
| COMPARATIVE EXAMPLE 2 | $4.1 \times 10^{-7}$ | $1.5 \times 10^{-9}$ | 3.7 | 11.0 |

COMPARATIVE EXAMPLE 2

An element was prepared by repeating EXAMPLE 1, except that no charge transport layer was formed. The element was evaluated in an electric field having the same strength as in EXAMPLE 1 (a voltage of 22.5 V was applied). The results are shown in TABLE 2. It showed such long rise and decay times as to be capable of working only at a very low speed, as compared with any element having transport layer.

What is claimed is:

1. An image readout device comprising an integration of readout elements for converting image signals into electrical signals, each of said elements comprising a photoconductive layer and a pair of electrodes which contact said layer, and between which said layer is disposed, wherein said photoconductive layer contains a charge generation material and a charge transport material, and said charge generation material is oxytitanium phthalocyanine.

2. An image readout device as set forth in claim 1, wherein said oxytitanium phthalocyanine has a crystal structure selected from the group consisting of the A, B and D forms.

3. An image readout device as set forth in claim 1, wherein said charge transport material is at least one material selected from the group consisting of a hydrazone derivative, a pyrazoline derivative, a derivative of a heterocyclic compound, an arylamine derivative, a stilbene derivative, a high-molecular compound containing any of the above derivatives in its side chain, and a high-molecular compound containing any of the above derivatives in its principal chain.

4. An image readout device as set forth in claim 1, wherein said photoconductive layer consists of a layer of said charge generation material and a layer of said charge transport material.

5. An image readout device as set forth in claim 4, wherein said layer of said charge generation material has a thickness of 0.05 to 2 microns.

6. An image readout device as set forth in claim 4, wherein said layer of said charge transport material has a thickness of 0.2 to 20 microns.

7. An image readout device as set forth in claim 1, wherein said photoconductive layer consists of a single layer.

8. An image readout device as set forth in claim 7, wherein said photoconductive layer has a thickness of 0.1 to 20 microns.

* * * * *